US010739891B2

(12) United States Patent
Lin et al.

(10) Patent No.: US 10,739,891 B2
(45) Date of Patent: Aug. 11, 2020

(54) TOUCH DISPLAY DEVICE

(71) Applicant: Innolux Corporation, Miao-Li County (TW)

(72) Inventors: Tien-Jen Lin, Miao-Li County (TW); Ching-Hsin Wu, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 16/175,917

(22) Filed: Oct. 31, 2018

(65) Prior Publication Data

US 2019/0163302 A1    May 30, 2019

Related U.S. Application Data

(60) Provisional application No. 62/592,451, filed on Nov. 30, 2017.

(30) Foreign Application Priority Data

May 22, 2018    (CN) .......................... 2018 1 0494264

(51) Int. Cl.
*G06F 3/038*     (2013.01)
*G06F 3/041*     (2006.01)
*H05K 1/14*      (2006.01)
*H01L 27/12*     (2006.01)

(52) U.S. Cl.
CPC .......... *G06F 3/0412* (2013.01); *G06F 3/0416* (2013.01); *H05K 1/147* (2013.01); *G06F 2203/04103* (2013.01); *H01L 27/124* (2013.01); *H05K 2201/10128* (2013.01); *H05K 2201/10151* (2013.01)

(58) Field of Classification Search
USPC ................ 345/156, 173, 174, 204, 206, 205
See application file for complete search history.

(56) References Cited

U.S. PATENT DOCUMENTS

| | | | | |
|---|---|---|---|---|
| 2011/0141043 | A1* | 6/2011 | Soubrie | G06F 3/04883 345/173 |
| 2016/0139706 | A1* | 5/2016 | Lee | G06F 3/044 345/174 |
| 2016/0162084 | A1* | 6/2016 | Wang | G06F 3/044 345/173 |
| 2017/0235414 | A1* | 8/2017 | Ding | G02F 1/134309 345/174 |
| 2017/0357353 | A1* | 12/2017 | Katsuta | G06F 3/0412 345/173 |

(Continued)

*Primary Examiner* — Thuy N Pardo
(74) *Attorney, Agent, or Firm* — McClure, Qualey & Rodack, LLP.

(57) ABSTRACT

A display device including a array substrate, at least one connection board, at least one display control circuit, at least one touch control circuit, a control board, and a number of wires is provided. An upper surface of the array substrate has a normal direction. The connection board is electrically connected to the array substrate. The display control circuit is electrically connected to the array substrate. The touch control circuit is electrically connected to the array substrate. The control board is electrically connected to the connection board. A portion of the wires connected to the touch control circuit at least partially overlap a portion of the wires connected to the display control circuit along the normal direction.

20 Claims, 5 Drawing Sheets

(56) References Cited

U.S. PATENT DOCUMENTS

| | | | |
|---|---|---|---|
| 2017/0363919 A1* | 12/2017 | Li | G02F 1/134336 |
| | | | 345/156 |
| 2018/0081472 A1* | 3/2018 | Xi | G06F 3/0412 |
| | | | 345/174 |
| 2018/0260061 A1* | 9/2018 | Hirota | G06F 3/0416 |
| | | | 345/173 |
| 2019/0146621 A1* | 5/2019 | Aoki | G06F 3/04164 |
| | | | 345/174 |
| 2019/0155434 A1* | 5/2019 | Katsuta | G06F 3/0412 |
| | | | 345/174 |

* cited by examiner

TOUCH DISPLAY DEVICE

This application claims the benefit of U.S. provisional application Ser. No. 62/592,451, filed Nov. 30, 2017 and People's Republic of China application Serial No. 201810494264.5, filed May 22, 2018, the subject matters of which are incorporated herein by reference.

BACKGROUND

Field of the Invention

The disclosure relates in general to a display device, and more particularly to a touch display device including a display control circuit and a touch control circuit.

Description of the Related Art

Recently, the demand for the touch display device is ever increasing. The touch display device can be divided into the in cell touch display device and the outer cell touch display device according to the position of the touch panel. While the touch panel of the former is directly disposed in the display panel, the touch panel of the latter is additionally disposed on the display panel.

Currently, a touch with display driver integration (TDDI) chip integrating the display control circuit and the touch control circuit can be used in the in cell touch display. However, to manufacture the said TDDI chip, the quantity of pins of the touch control circuit and that of the display control circuit need to be adjusted according to the size of the display panel, and the manufacturing cost of the touch display panel will therefore be increased. Thus, it has become a prominent task for the industry to provide a touch display device capable of reducing the manufacturing cost of the touch display device.

SUMMARY OF THE DISCLOSURE

The disclosure is directed to a display device. The display device comprises an array substrate, at least one connection board, at least one display control circuit, at least one touch control circuit, a control board, and a number of wires. An upper surface of the array substrate has a normal direction. The connection board is electrically connected to the array substrate. The display control circuit is electrically connected to the array substrate. The touch control circuit is electrically connected to the array substrate. The control board is electrically connected to the connection board. A portion of the wires connected to the touch control circuit at least partially overlap a portion of the wires connected to the display control circuit along the normal direction.

The above and other aspects of the disclosure will become better understood with regard to the following detailed description of an embodiment but non-limiting embodiment(s). The following description is made with reference to the accompanying drawings.

BRIEF DESCRIPTION OF THE DRAWINGS

FIG. 20 is an enlarged view of a portion C of the touch display device of FIG. 2A.

DETAILED DESCRIPTION OF THE DISCLOSURE

Use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1A:
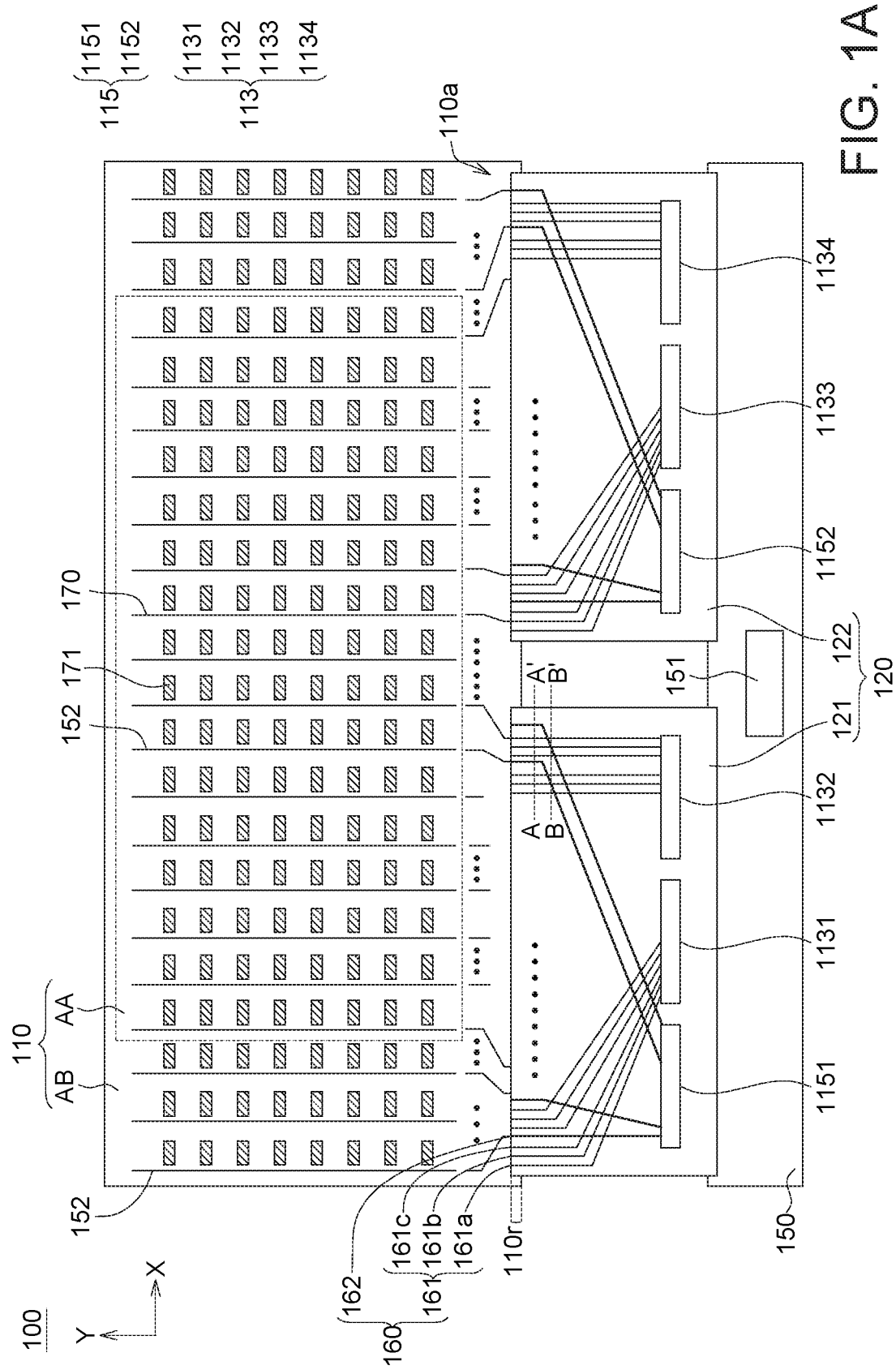
FIG. 1A is a top view of a touch display device according to an embodiment of the present disclosure.
Figure 1B:
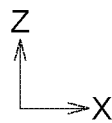
FIG. 1B is a cross-sectional view of a part of the touch display device of FIG. 1A along a cross-sectional line A-A'.
Figure 1B:
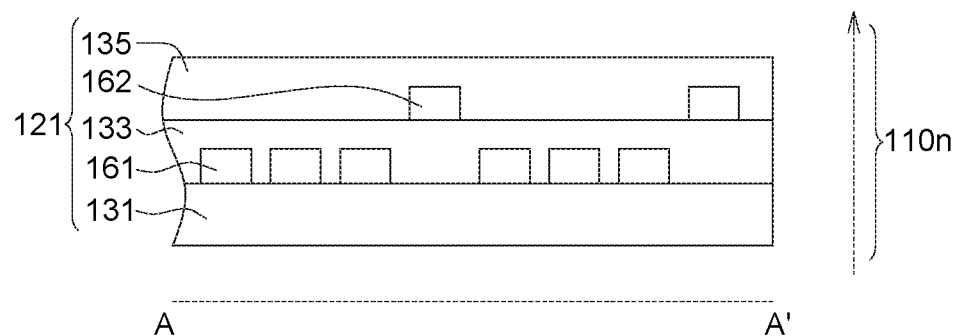
Figure 1C:
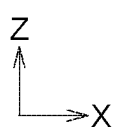
FIG. 1C is a cross-sectional view of a part of the touch display device of FIG. 1A along a cross-sectional line B-B'.
Figure 1C:
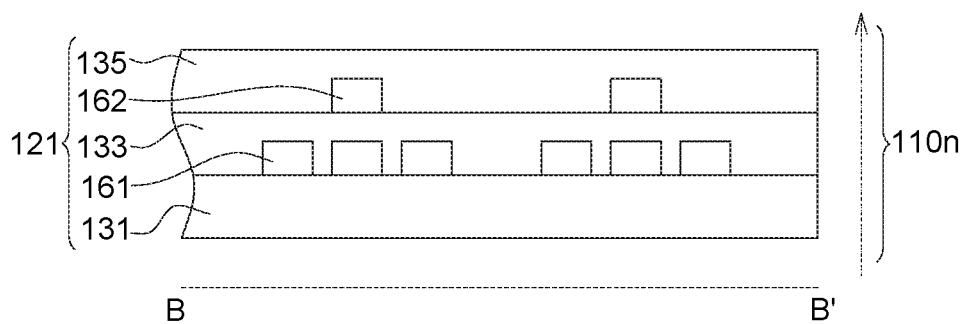

FIG. 1A is a top view of a touch display device 100 according to an embodiment of the present disclosure. FIG. 1B is a cross-sectional view of a part of the touch display device 100 of FIG. 1A along a cross-sectional line A-A'. FIG. 1C is a cross-sectional view of a part of the touch display device 100 of FIG. 1A along a cross-sectional line B-B'. FIG. 1A illustrates a plane formed by the X-axis and the Y-axis. FIGS. 1B and 1C illustrate a plane formed by the X-axis and the Z-axis. The X-axis, the Y-axis and the Z-axis are perpendicular to each other.

Refer to FIGS. 1A, 1B and 1C. The touch display device 100 comprises an array substrate 110, a connection board 120, a display control circuit 113, a touch control circuit 115, a control board 150, and a number of wires 160. The array substrate 110 has a trace region 110r. An upper surface 110a of the array substrate 110 has a normal direction 110n (FIGS. 1B and 1C). The trace region 110r denotes a joint region between the array substrate 110 and the connection board 120 and electrically connects the array substrate 110 to the display control circuit 113 or the touch control circuit 115 disposed on the connection board 120. The trace region 110r may have a pad (not illustrated) disposed therein. The array substrate 110 has a pixel region AA and a peripheral region AB. The array substrate 110 comprises the active layer, and the active array layer corresponds to the pixel region AA and comprises a number of data lines 170, a number of drain electrodes 171, a number of scan lines (not illustrated), a number of touch lines 152 and a number of pixel arrays. A portion of the drain electrodes 171 are usually electrically connected to the touch line 152 respectively and the other portion of the drain electrodes 171 are also electrically connected to the data lines 170 respectively. The data lines 170 and the touch lines 152 can be disposed according to a staggering arrangement, an overlapping arrangement or a combination thereof, and the present disclosure does not have specific restrictions regarding the said arrangement. In some embodiments, the wires in the pixel region AA and the peripheral region AB (such as data lines or touch lines) are connected to the wires in the trace region 110r. FIG. 1A is used for an exemplary purpose only, not for limiting the scope of protection of the present disclosure.

The upper surface 110a of the array substrate 110 is parallel to an extending direction of the X-axis. The normal direction 110n is perpendicular to the upper surface 11a, that is, parallel to an extending direction of the Z-axis. The display control circuit 113 may comprises a driver IC. The touch control circuit 115 may comprises a touch IC. The control board 150 may comprise a signal processing unit 151, which can be realized by a timing controller (TCON), a microcontroller unit (MCU), or a combination thereof.

The connection board 120, the display control circuit 113, and the touch control circuit 115 can respectively be electrically connected to the array substrate 110 through a plurality of wires 160. The connection board 120, the display control circuit 113, and the touch control circuit 115 can respectively be electrically connected to the control board 150 through a plurality of wires (not illustrated). In view of the normal direction, a portion of the wires 160 connected to the touch control circuit 115 at least partially overlap a portion of the wires 160 connected to the display control circuit 113.

In the present embodiment, the connection board 120 comprises a first connection board 121 and a second connection board 122. The first connection board 121 and the second connection board 122 respectively are electrically connected to the array substrate 110. The display control circuit 113 comprises a first display control circuit 1131, a second display control circuit 1132, a third display control circuit 1133 and a fourth display control circuit 1134. All of the first display control circuit 1131 and the second display control circuit 1132 are disposed on the first connection board 121. Both the third display control circuit 1133 and the fourth display control circuit 1134 are disposed on the second connection board 122. The first display control circuit 1131, the second display control circuit 1132, the third display control circuit 1133 and the fourth display control circuit 1134 respectively are electrically connected to the array substrate 110. The touch control circuit 115 comprises a first touch control circuit 1151 and a second touch control circuit 1152. The first touch control circuit 1151 and the second touch control circuit 1152 are respectively disposed on the first connection board 121 and the second connection board 122 and electrically connected to the array substrate 110. The wires 160 may comprise a number of first wires 161 and a number of second wires 162. The first wires 161 electrically connect the array substrate 110 to the first display control circuit 1131, the second display control circuit 1132, the third display control circuit 1133 and the fourth display control circuit 1134 from the trace region 110r. The second wires 162 electrically connect the array substrate 110 to the first touch control circuit 1151 and the second touch control circuit 1152 from the trace region 110r. In the present disclosure, the first wires 161 connect the array substrate 110, the display control circuit 113 and the signal processing unit 151. The second wires 162 connect the array substrate 110, the touch control circuit 115 and the signal processing unit 151. In an embodiment, the first wires 161 may comprise a red signal wire 161a, a green signal wire 161b, and a blue signal wire 161c. The red signal wire 161a is used for transmitting a red signal. The green signal wire 161b is used for transmitting a green signal. The blue signal wire 161c is used for transmitting a blue signal. In some other embodiments, the first wires 161 are used for transmitting a display signal to control the ON/OFF (bright/dark) state of a pixel. As indicated in FIG. 1A, the wires 160 can be arranged according to the order of the red signal wire 161a, the green signal wire 161b, the blue signal wire 161c, and the second wires 162. In other embodiment, the first wires further comprise a yellow signal wire, and the wires can be arranged according to the order of the red signal wire, the green signal wire, the blue signal wire, the yellow signal wire, and the second wires. However, the present disclosure is not limited thereto, and the variety of the first wires and the order and arrangement of the first wires and the second wires can be adjusted according to actual needs.

In the present embodiment, the first display control circuit 1131 is disposed between the first touch control circuit 1151 and the second display control circuit 1132. The third display control circuit 1133 is disposed between the second touch control circuit 1152 and the fourth display control circuit 1134. However, the present disclosure is not limited thereto, and, the display control circuit 113 and the quantity and arrangement of touch control circuit 115 can be adjusted according to actual needs.

The array substrate 110 is connected to the first connection board 121 and the second connection board 122. The first connection board 121 and the second connection board 122 may have the same structure. Refer to FIGS. 1B and 1C. The first connection board 121 comprises a first film layer 131, a number of first wires 161, a first insulation layer 133, a number of second wires 162, and a second insulation layer 135. In the first connection board 121 as indicated in FIG. 1B, the first wires 161 are formed on the first film layer 131, the first insulation layer 133 covers the first wires 161, the second wires 162 are formed on the first insulation layer 133, and the second insulation layer 135 covers the second wires 162. As indicated in FIG. 1C, the second wires 162 partially overlap the first wires 161 along the normal direction 110n. The array substrate 110 can be realized by a glass array substrate. The first film layer 131 can be realized by a flexible printed circuit (FPC) board comprising, such as, polyimide. The first wires 161 and the second wires 162 can comprise a metal material (such as but not limited to gold, silver, copper, aluminum, an alloy thereof, or a combination thereof) or a conductive material (a non-metal conductive material such as but not limited to ITO, IZO, or CNT). The first insulation layer 133 and the second insulation layer 135 can comprise silicon nitride, silicon oxide or any insulating materials (including an organic material, an inorganic material, or combination thereof). In an embodiment, the display control circuit 113 and the touch control circuit 115 can be bonded on the connection board 120 by using the chip on film (COF) technology. For example, the display control circuit 113 and the touch control circuit 115 can be bonded on the connection board 120 by using the inner lead bonding (ILB) technology.

Figure 1D:
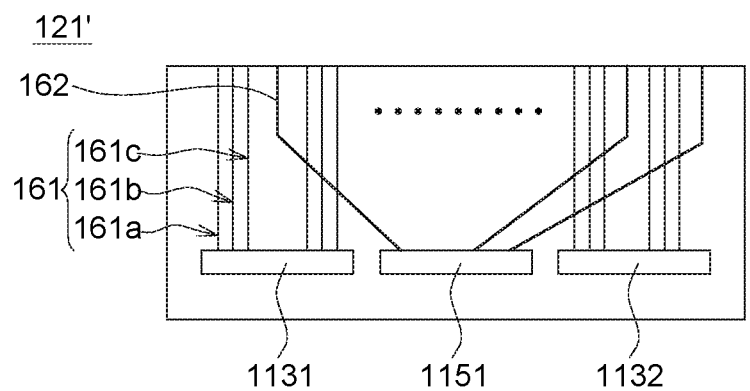
FIG. 1D is a top view of a connection board of a touch display device according to an embodiment of the present disclosure.

FIG. 1D is a top view of a connection board 121' of a touch display device 100 according to an embodiment of the present disclosure. The first connection board 121' is different from the first connection board 121 in that the first touch control circuit 1151 is disposed between the first display control circuit 1131 and the second display control circuit 1132. Similarly, the disposition of the second connection board can be similar to that of the first connection board 121'. That is, the touch control circuit is disposed between the display control circuits.

Figure 1E:
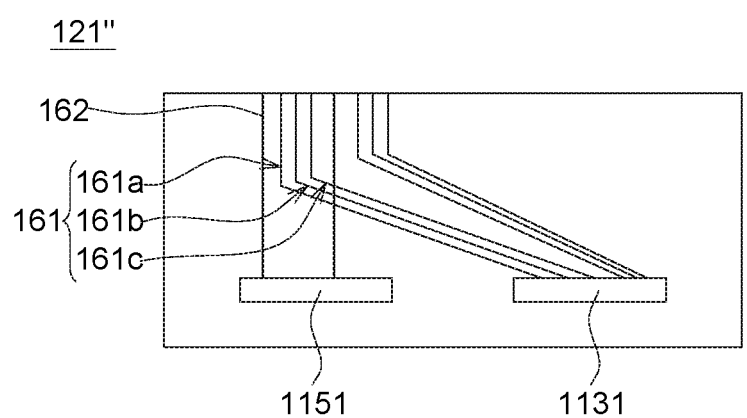
FIG. 1E is a top view of a connection board of a touch display device according to an embodiment of the present disclosure.

FIG. 1E is a top view of a first connection board 121" of a touch display device 100 according to an embodiment of the present disclosure. The first connection board 121" is different from the first connection board 121 in that both the quantity of the touch control circuit 115 and that of the display control circuit 113 are exemplified by 1. That is, the connection board 121" has a first touch control circuit 1151 and a first display control circuit 1131. Similarly, the disposition of the second connection board can be similar to that of the first connection board 121". That is, both the quantity of the touch control circuit and that of the display control circuit are exemplified by 1.

Figure 2A:
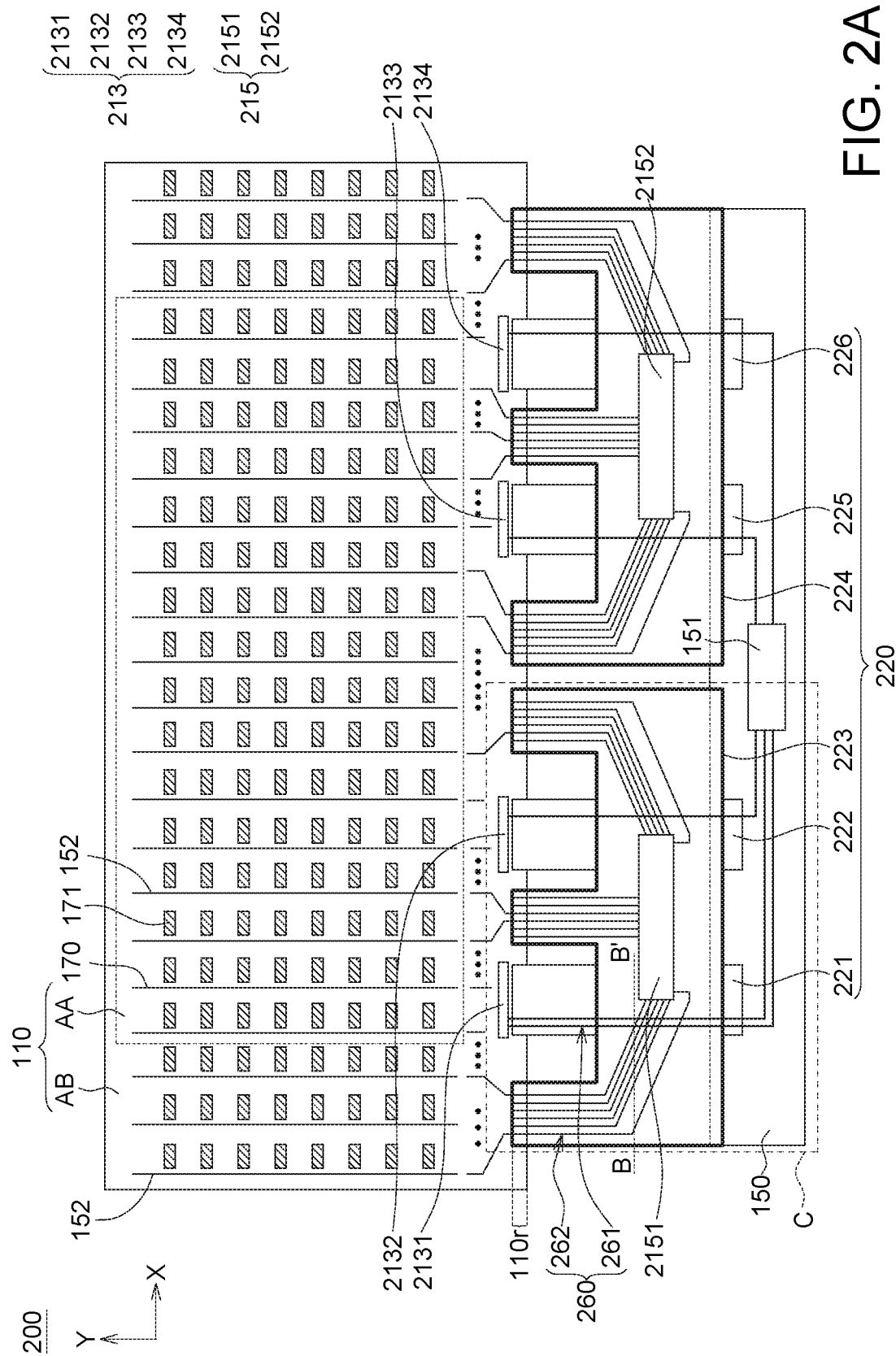
FIG. 2A is a top view of a touch display device according to another embodiment of the present disclosure.
Figure 2B:
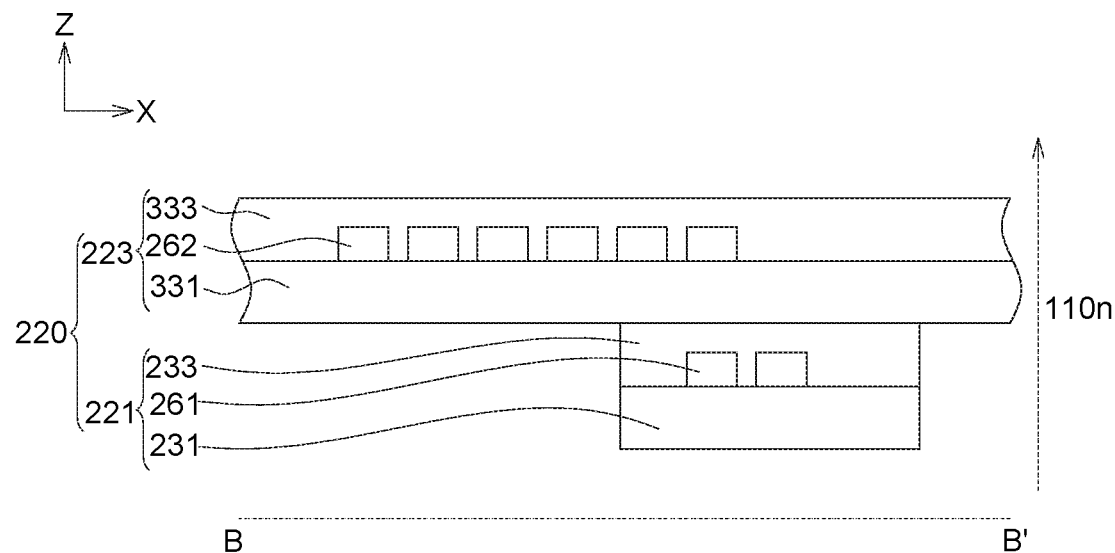
FIG. 2B is a cross-sectional view of a part of the touch display device of FIG. 2A along a cross-sectional line B-B'.
Figure 2C:
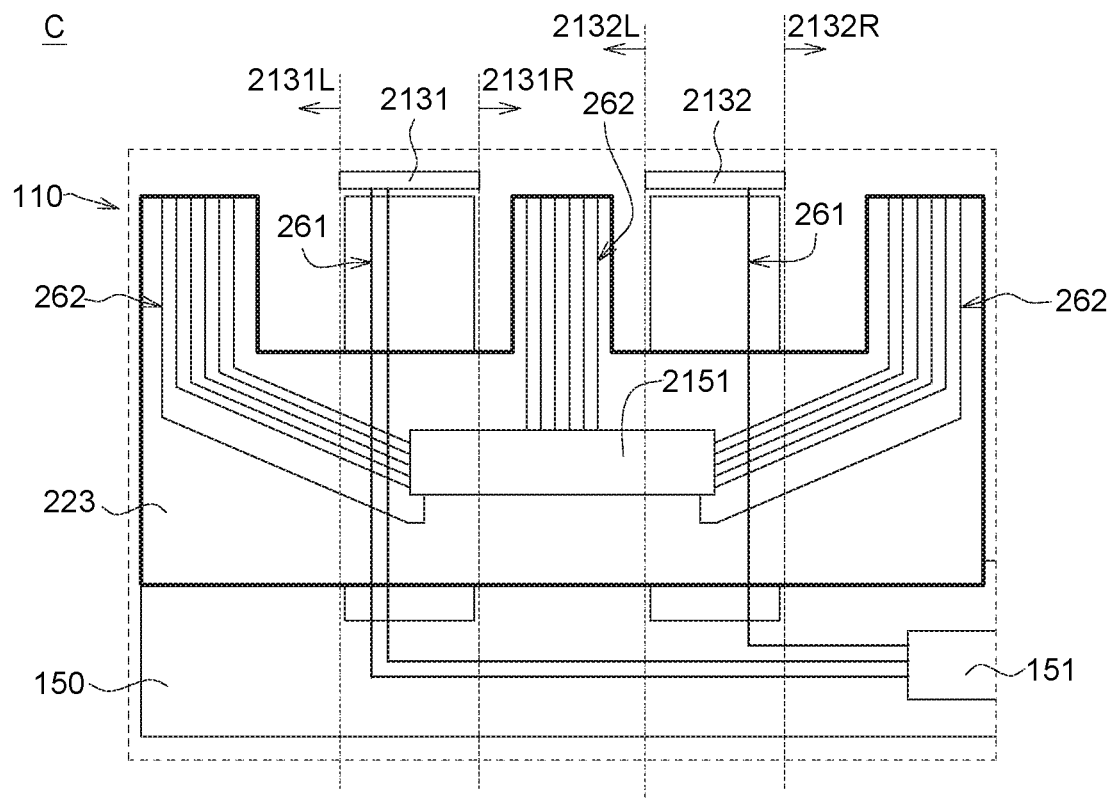

FIG. 2A is a top view of a touch display device 200 according to another embodiment of the present disclosure. FIG. 2B is a cross-sectional view of a part of the touch display device 200 of FIG. 2A along a cross-sectional line B-B'. FIG. 2C is an enlarged view of a portion C of the touch display device 200 of FIG. 2A. FIGS. 2A and 2C illustrate a plane formed by the X-axis and the Y-axis. FIG. 2B illustrates a plane formed by the X-axis and the Z-axis. The X-axis, the Y-axis and the Z-axis are perpendicular to each other. The touch display device 200 of FIG. 2A is different from the touch display device 100 of FIG. 1A in that the display control circuit 213 is disposed on the array substrate 110.

Refer to FIG. 2A, the display control circuit 213 comprises a first display control circuit 2131, a second display control circuit 2132, a third display control circuit 2133 and a fourth display control circuit 2134. For example, the first display control circuit 2131, the second display control circuit 2132, the third display control circuit 2133 and the fourth display control circuit 2134 can be disposed on the array substrate 110 by using the chip on glass (COG) technology. The touch control circuit 215 comprises a first touch control circuit 2151 and a second touch control circuit 2152. The connection board 220 comprises a first connection board 221, a second connection board 222, a third connection board 223, a fourth connection board 224, a fifth connection board 225, and a sixth connection board 226. The first touch control circuit 2151 and the second touch control circuit 2152 respectively are disposed on the third connection board 223 and the fourth connection board 224 by using the chip on film (COF) technology. The first connection board 221 electrically connects the first display control circuit 2131 to the control board 150. The second connection board 222 electrically connects the second display control circuit 2132 to the control board 150. The third connection board 223 electrically connects the first touch control circuit 2151 to the array substrate 110. The fourth connection board 224 electrically connects the second touch control circuit 2152 to the array substrate 110. The third connection board 223 and the fourth connection board 224 respectively are electrically connected to the control board 150.

The wires 260 may comprise a number of first wires 261 and a number of second wires 262. Each of the first wires 261 is electrically connected to the control board 150 (such as the signal processing unit 151 of the control board 150) from the display control circuit 213 (such as the first display control circuit 2131, the second display control circuit 2132, the third display control circuit 2133 and the fourth display control circuit 2134) on the array substrate 110 through the connection board 220 (such as the first connection board 221, the second connection board 222, the fifth connection board 225 and the sixth connection board 226). Each of the second wires 262 is electrically connected to the touch control circuit 215 (such as the first touch control circuit 2151 and the second touch control circuit 2152) from the array substrate 110 through the connection board 220 (such as the third connection board 223 and the fourth connection board 224), and then is electrically connected to the control board 150 (such as the signal processing unit 151 on the control board 150) from the touch control circuit 215.

Refer to FIGS. 2A and 2B. A portion of the first wires 261 at least partially overlap a portion of the second wires 262 along the normal direction 110n. The portion of the first wires 261 overlapping the second wires 262 and the portion of the second wire 262 overlapping the first wires 261 are not limited to the wires connected to the touch control circuit 215 or the wires connected to the display control circuit 213. A portion of the first connection board 221 and the second connection board 222 at least partially overlap the third connection board 223 along the normal direction 110n (such as the Z-axis direction). A part of the fifth connection board 225 and the sixth connection board 226 at least partially overlap the fourth connection board 224 along the normal direction 110n.

Refer to FIG. 2B. The third connection board 223 is disposed on the first circuit board 221. The first connection board 221 comprises a first film layer 231, a number of first wires 261, and a first insulation layer 233. The third connection board 223 comprises a second film layer 331, a number of second wires 262, and a second insulation layer 333. The first wires 261 are formed on the first film layer 231. The first insulation layer 233 covers the first wires 261. The second film layer 331 is formed on the first insulation layer 233. The second wires 262 are formed on the second film layer 331. The second insulation layer 333 covers the second wires 262. The second wires 262 may partially overlap the first wires 261 along the normal direction 110n. The first film layer 231 and the second film layer 331 can be realized by a flexible printed circuit board (FPCB) and can comprise, such as, polyimide (PI). The first wires 261 and the second wires 262 can comprise a metal material. The first insulation layer 233 and the second insulation layer 333 can comprise silicon nitride, silicon oxide or any insulating materials.

Refer to FIG. 2C, the first display control circuit 2131 has a first side 2131L and a second side 2131R opposite to the first side 2131L. The second display control circuit 2132 has a third side 2132L and a fourth side 2132R opposite to the third side 2132L. The second side 2131R is adjacent to the third side 2132L. The first touch control circuit 2151 is electrically connected to the trace region 11r on the array substrate 110 through a number of wires 260 (such as a number of second wires 262). A portion of the wires 260 (such as the second wires 262) are connected to the trace region 110r on the first side 2131L. A portion of the wires 260 (such as the second wires 262) are connected to the trace region 110r on the second side 2131R. A portion of the wires 260 (such as the second wires 262) are connected to the trace region 110r on the third side 2132L. A portion of the wires 260 (such as the second wires 262) are connected to the trace region 110r on the fourth side 2132R.

In the present embodiment, the connection boards 120 and 220 both can be realized by a multi-layered connection board. Since the first wires 161 electrically connected to the display control circuit 113 and the second wires 162 electrically connected to the touch control circuit 115 can be disposed on different layers of the multi-layered connection board, the traces of the second wires 162 can have a larger design space in response to the panels of different sizes.

The quantity of channels in a touch control circuit is positively proportional to the area of a panel. For example, in a 15.6" panel, the touch with display driver integration (TDDI) chip needs to have 3,600 channels; in an 11.6" panel, the TDDI chip needs to have 2,170 channels. To form a TDDI chip for the panel of a particular size, a touch control circuit with a corresponding quantity of channels and a display control circuit with a corresponding quantity of channels are required. However, such design increases the manufacturing cost of the touch display pane. The channels of the control circuit refer to the pins of the control circuit. The control circuit can transmit signals (the red, the green, the blue, and the touch signals) to the display panel through the wires connected to the channels (pins). The touch control circuit of the present disclosure directly uses the touch control circuit and the display control circuit of existing specifications, and can electrically connect the array substrate, the touch control circuit, the display control circuit and the control board by adapting the design of multi-layered connection board without having to fabricate a particular TDDI chip corresponding to the panel of the particular size. Thus, the manufacturing cost of the touch display device is reduced and product competitiveness is enhanced.

While the disclosure has been described by way of example and in terms of the preferred embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
   an array substrate, wherein an upper surface of the array substrate has a normal direction;
   at least one connection board electrically connected to the array substrate;
   at least one display control circuit electrically connected to the array substrate;
   at least one touch control circuit electrically connected to the array substrate;
   a control board electrically connected to the at least one connection board; and
   a plurality of wires disposed on the at least one connection board;
   wherein in view of the normal direction, a portion of the wires disposed on the at least one connection board and connected to the at least one touch control circuit at least partially overlaps a portion of the wires disposed on the at least one connection board and connected to the at least one display control circuit.

2. The display device according to claim 1, wherein the at least one connection board comprises:
   a first connection board electrically connected to the array substrate; and
   a second connection board electrically connected to the array substrate.

3. The display device according to claim 2, wherein the at least one display control circuit comprises a first display control circuit and a second display control circuit, the first display control circuit is disposed on the first connection board and electrically connected to the array substrate, and the second display control circuit is disposed on the first connection board and electrically connected to the array substrate; and
   the at least one touch control circuit comprises a first touch control circuit disposed on the first connection board and electrically connected to the array substrate.

4. The display device according to claim 3, wherein the first display control circuit is disposed between the first touch control circuit and the second display control circuit.

5. The display device according to claim 4, wherein the at least one display control circuit comprises a third display control circuit and a fourth display control circuit, the third display control circuit is disposed on the second connection board and electrically connected to the array substrate, and the fourth display control circuit is disposed on the second connection board and electrically connected to the array substrate; and
   the at least one touch control circuit comprises a second touch control circuit disposed on the second connection board and electrically connected to the array substrate.

6. The display device according to claim 3, wherein the third display control circuit is disposed between the second touch control circuit and the fourth display control circuit.

7. The display device according to claim 3, wherein the first touch control circuit is disposed between the first display control circuit and the second display control circuit.

8. The display device according to claim 3, further comprising a trace region being a joint region between the array substrate and the connection board.

9. The display device according to claim 8, wherein the array substrate have the trace region to which the first display control circuit, the second display control circuit and the first touch control circuit are connected through the wires.

10. The display device according to claim 3, wherein the at least one connection board is a multi-layered connection board, and the multi-layered connection board comprises:
    a first wire electrically connected to the first display control circuit;
    a second wire electrically connected to the first touch control circuit.

11. The display device according to claim 10, wherein the multi-layered connection board comprises:
    a first film layer;
    a plurality of the first wires formed on the first film layer;
    a first insulation layer covering the first wires;
    a plurality of the second wires formed on the first insulation layer; and
    a second insulation layer covering the second wires, wherein the second wires partially overlap the first wires along the normal direction.

12. The display device according to claim 11, wherein the first film layer is realized by a flexible printed circuit.

13. The display device according to claim 2, wherein the at least one display control circuit comprises a first display control circuit disposed on the first connection board and electrically connected to the array substrate; and
    the at least one touch control circuit comprises a first touch control circuit disposed on the first connection board and electrically connected to the array substrate.

14. The display device according to claim 13, wherein the at least one connection board is a multi-layered connection board, and the multi-layered connection board comprises:
    a first wire electrically connected to the first display control circuit; and
    a second wire electrically connected to the first touch control circuit.

15. The display device according to claim 1, wherein the at least one display control circuit comprises a first display control circuit and a second display control circuit, the first display control circuit has a first side and a second side opposite to the first side, the first display control circuit is disposed on the array substrate and connected to the control board through the at least one connection board; the second display control circuit has a third side and a fourth side opposite to the third side, the second display control circuit is disposed on the array substrate and connected to the control board through the at least one connection board, and the second side is adjacent to the third side.

16. The display device according to claim 15, wherein the at least one display control circuit further comprises a third display control circuit and a fourth second display control circuit disposed on the array substrate.

17. The display device according to claim 15, wherein the at least one touch control circuit comprises a first touch control circuit disposed on the at least one connection board, the array substrate has a trace region to which the first touch control circuit is connected through the wires, a portion of the wires are connected to the trace region on the first side, and a portion of the wires are connected to the trace region on the second side.

18. The display device according to claim 17, wherein the at least one connection board is a multi-layered connection board, and the multi-layered connection board comprises:
- a first wire electrically connected to the first display control circuit;
- a second wire electrically connected to the first touch control circuit.

19. The display device according to claim 18, wherein the multi-layered connection board further comprises:
- a first film layer;
- a plurality of the first wires formed on the first film layer;
- a first insulation layer covering the first wires;
- a plurality of the second wires formed on the first insulation layer; and
- a second insulation layer covering the second wires, wherein the second wires partially overlap the first wires along the normal direction.

20. The display device according to claim 15, wherein the at least one touch control circuit comprises a first touch control circuit disposed on the at least one connection board, the array substrate has a trace region to which the first touch control circuit is connected through the wires, a portion of the wires are connected to the trace region on the third side, and a portion of the wires are connected to the trace region on the fourth side.

* * * * *